(12) United States Patent
Kinoshita et al.

(10) Patent No.: US 7,893,483 B2
(45) Date of Patent: Feb. 22, 2011

(54) NEURON DEVICE

(75) Inventors: Atsuhiro Kinoshita, Kamakura (JP); Yoshifumi Nishi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 333 days.

(21) Appl. No.: 12/043,193

(22) Filed: Mar. 6, 2008

(65) Prior Publication Data
US 2009/0250742 A1  Oct. 8, 2009

(30) Foreign Application Priority Data
Mar. 26, 2007  (JP) ............................. 2007-079735

(51) Int. Cl.
*H01L 29/788* (2006.01)
(52) U.S. Cl. .................... 257/319; 257/347; 257/E29.3
(58) Field of Classification Search ................ 257/319, 257/347, E29.3, 314, 315, 318, 350, 351, 257/E29.302, E27.112
See application file for complete search history.

(56) References Cited

U.S. PATENT DOCUMENTS 5,539,329 A * 7/1996 Shibata et al. ................ 326/39
5,621,336 A * 4/1997 Shibata et al. ................ 326/36
5,753,954 A * 5/1998 Chi et al. ..................... 257/318
6,407,425 B1 * 6/2002 Babcock et al. ............. 257/318
2002/0105833 A1 * 8/2002 Aoyama et al. ........ 365/185.24

FOREIGN PATENT DOCUMENTS

JP  2001-266106  9/2001

* cited by examiner

*Primary Examiner*—Thomas L Dickey
*Assistant Examiner*—Fazli Erdem
(74) *Attorney, Agent, or Firm*—Finnegan, Henderson, Farabow, Garrett & Dunner, L.L.P.

(57) ABSTRACT

A neuron device includes: a semiconductor layer; source and drain regions formed in the semiconductor layer at a distance from each other; a protection film formed on an upper face of the semiconductor layer; a channel region formed in the semiconductor layer between the source region and the drain region; a pair of gate insulating films formed on two side faces of the channel region; a floating gate electrode including: a first portion covered on the gate insulating films and the protection film; a second portion connected to the first portion; and a third portion provided on the substrate so as to connect to the end portion of the second portion on the opposite side from the first portion; an interelectrode insulating film provided on the first to third portions; and a plurality of control gate electrodes provided on the third portion.

10 Claims, 14 Drawing Sheets

A-A SECTION

A-A SECTION

B-B SECTION

C-C SECTION

A-A SECTION

A-A SECTION

A-A SECTION

NEURON DEVICE

CROSS-REFERENCE TO RELATED APPLICATION

This application is based upon and claims the benefit of priority from prior Japanese Patent Application No. 2007-79735 filed on Mar. 26, 2007 in Japan, the entire contents of which are incorporated herein by reference.

BACKGROUND OF THE INVENTION

1. Field of the Invention

The present invention relates to neuron devices.

2. Related Art

To improve the performance of a semiconductor integrated circuit, the field effect transistors that form the semiconductor integrated circuit must exhibit high performance. The essential requirement for high-performance devices is miniaturization of devices, and so far, the performance of devices has been improved by miniaturizing the devices. However, as the devices became smaller, the technique problems to be solved became larger. According to the international semiconductor roadmap, very large technical difficulty is expected to accompany the development of the 45 nm generation and later generations.

In these circumstances, various techniques for improving performances other than miniaturization have been studied. One of the suggestions is the technique for achieving a high-performance system by employing MOS field effect transistors called neuron MOS transistors (hereinafter also referred to as neuron devices) as the basic gates instead of conventional transistors (see JP-A 2001-266106 (KOKAI), for example). Each of such MOS field effect transistors has more than one gate and a floating gate.

However, each neuron MOS transistor employed by the conventional techniques has poorer switching characteristics than conventional MOS transistors. Therefore, if a system that can be formed with conventional MOS transistors is formed with neuron MOS transistors, such a system has few advantages. As a result, the range of application of neuron MOS transistors is limited to the application developed especially for neuron MOS transistors. More specifically, having a small short-channel effect immunity, conventional neuron MOS transistors cannot be miniaturized. Also, since the conventional neuron MOS transistors exhibit low channel charge density during ON operations, the current drivability cannot be made larger.

As described above, the conventional neuron MOS transistors have the difficulty in miniaturization and small current drivability. This is because the potential of the channel is controlled by the capacitance coupling in each conventional neuron MOS transistor. Therefore, it is difficult to reduce the thickness of each gate insulating film in an equivalent manner, and as a result, the short-channel effect immunity and the channel charge density become lower.

SUMMARY OF THE INVENTION

The present invention has been made in view of these circumstances, and an object thereof is to provide a neuron device that can be easily made smaller and has large current drivability.

A neuron device according to a first aspect of the present invention includes: a semiconductor layer provided above a substrate and being of a first conductivity type; source and drain regions formed in the semiconductor layer at a distance from each other, and being of a second conductivity type; a protection film formed on an upper face of the semiconductor layer; a channel region formed in the semiconductor layer between the source region and the drain region; a pair of gate insulating films formed on two side faces of the channel region; a floating gate electrode including: a first portion provided on the two side faces and an upper face of the channel region, with the gate insulating films and the protection film being interposed between the first portion and the channel region respectively; a second portion connected to the first portion, and provided on the substrate so as to extend from one of the two side faces of the channel region in a direction perpendicular to the one of the two side faces; and a third portion provided on the substrate so as to connect to the end portion of the second portion on the opposite side from the first portion, and having a greater width than the first portion and the second portion; an interelectrode insulating film provided on the first to third portions of the floating gate electrode; and a plurality of control gate electrodes provided on the third portion of the floating gate electrode, so that the interelectrode insulating film is interposed between the third portion and the control gate electrodes.

A neuron device according to a second aspect of the present invention includes: a semiconductor layer provided above a substrate and being of a first conductivity type; source and drain regions formed in the semiconductor layer at a distance from each other, and being of a second conductivity type; a protection film formed on an upper face of the semiconductor layer; a channel region formed in the semiconductor layer between the source region and the drain region; a pair of gate insulating films formed on two side faces of the channel region; a floating gate electrode that includes: a first portion provided on the two side faces and an upper face of the channel region, with the gate insulating films and the protection film being interposed between the first portion and the channel region respectively; and second and third portions connected to the first portion, and provided on the substrate so as to extend from the two side faces of the channel region in directions perpendicular to the two side faces; an interelectrode insulating film provided on the first to third portions of the floating gate electrode; and first and second control gate electrodes provided on the second and third portions of the floating gate electrode, so that the interelectrode insulating film is interposed between the second and third portions and the first and second control gate electrodes.

A neuron device according to a third aspect of the present invention includes: first and second semiconductor layers provided in parallel above a substrate and being of a first conductivity type; first source and drain regions formed in the first semiconductor layer at a distance from each other, and being of a second conductivity type; second source and drain regions formed in the second semiconductor layer at a distance from each other, and being of the second conductivity type; first and second protection films formed on upper faces of the first and second semiconductor layers respectively; a first channel region formed in the first semiconductor layer between the first source region and the first drain region; a second channel region formed in the second semiconductor layer between the second source region and the second drain region; a pair of first gate insulating films formed on two side faces of the first channel region; a pair of second gate insulating films formed on two side faces of the second channel region; a floating gate electrode that includes: a first portion provided on the two side faces and an upper face of the first channel region, with the first gate insulating films and the first protection film being interposed between the first portion and the first channel region respectively; a second portion provided on the two side faces and an upper face of the second channel region, with the second gate insulating films and the second protection film being interposed between the second portion and the second channel region respectively; a third portion that connected to the first portion, and provided on the substrate so as to extend from the side face of the first channel region on the opposite side from the second channel region in a direction perpendicular to the side face; a fourth portion connected to the first and second portions, and provided on a portion of the substrate, the portion being located between the first channel region and the second channel region; and a fifth portion connected to the second portion, and provided on the substrate so as to extend from the side face of the second channel region on the opposite side from the first channel region in a direction perpendicular to the side face; an interelectrode insulating film provided on the first to fifth portions of the floating gate electrode; and first to third control gate electrodes provided on the third to fifth portions of the floating gate electrode respectively, so that the interelectrode insulating film is interposed between the third to fifth portions and the first to third control gate electrodes.

A neuron device according to a fourth aspect of the present invention includes: first and second semiconductor layers provided in parallel above a substrate and being of a first conductivity type; first source and drain regions formed in the first semiconductor layer at a distance from each other, and being of a second conductivity type; second source and drain regions formed in the second semiconductor layer at a distance from each other, and being of the second conductivity type; first and second protection films formed on upper faces of the first and second semiconductor layers respectively; a first channel region formed in the first semiconductor layer between the first source region and the first drain region; a second channel region formed in the second semiconductor layer between the second source region and the second drain region; a pair of first gate insulating films formed on two side faces of the first channel region; a pair of second gate insulating films formed on two side faces of the second channel region; a floating gate electrode provided to cover the first and second semiconductor layers; an interelectrode insulating film provided to cover the floating gate electrode; and first and second control gate electrodes provided above the first and second semiconductor layers, with the floating gate electrode and the interelectrode insulating film being interposed between the first and second semiconductor layers and the first and second control gate electrodes.

DESCRIPTION OF THE EMBODIMENTS

The following is a description of embodiments of the present invention, with reference to the accompanying drawings.

In this specification, a neuron device is a "neuron MOS transistor", and a neuron MOS transistor is a transistor that has a floating gate electrode provided on the region separating the source region and the drain region from each other, and control gate electrodes each forming capacitive coupling with the floating gate electrode. In the regular operation of such a neuron MOS transistor, an inversion layer is formed under the floating gate electrode, only if the absolute value of a value obtained by multiplying the voltage applied to each control electrode by a predetermined weight and performing linear addition is larger than a predetermined threshold voltage.

First Embodiment

Figure 1:
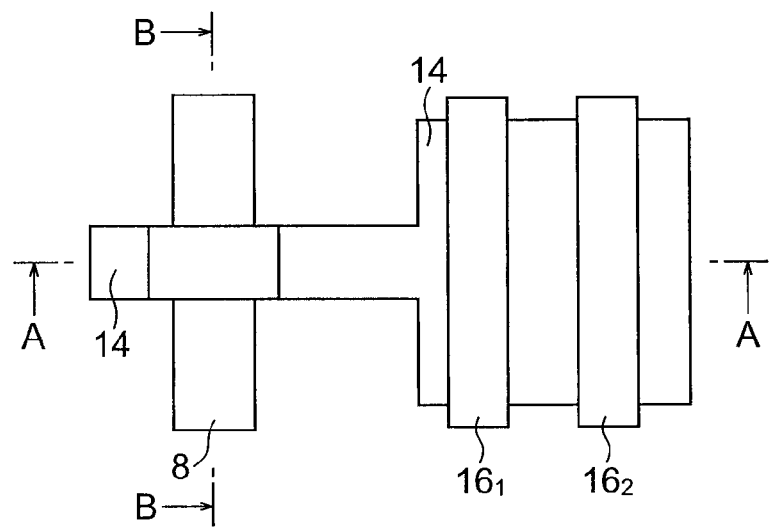
FIG. 1 is a plan view of a neuron device in accordance with a first embodiment of the present invention.
Figure 2:
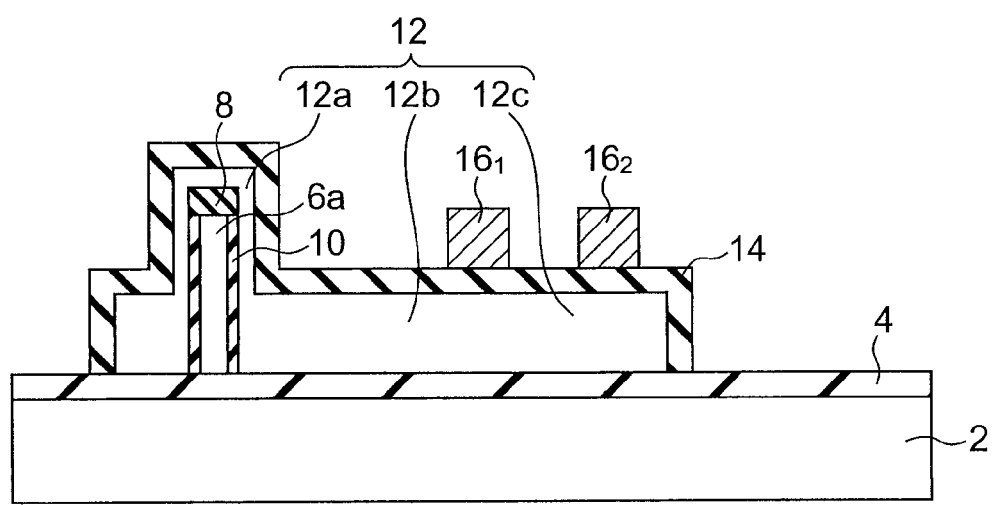
FIGS. 2 to 4 are cross-sectional views of the neuron device in accordance with the first embodiment.
Figure 3:
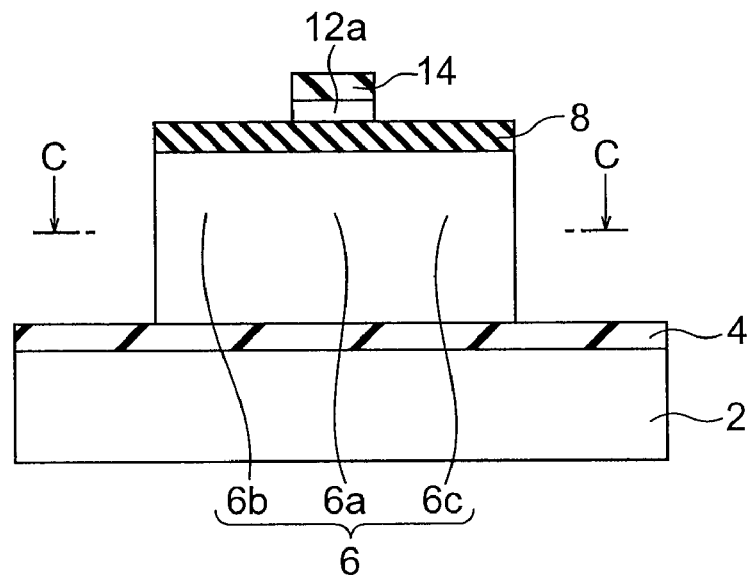
Figure 4:
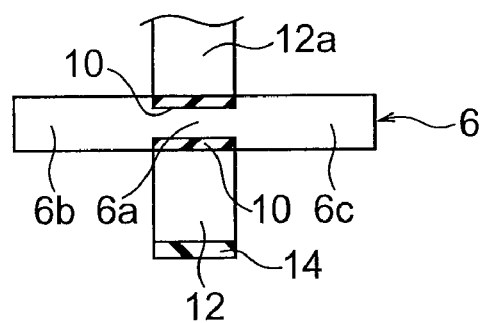

Referring to FIGS. 1 to 4, a neuron device in accordance with a first embodiment of the present invention is described. FIG. 1 is a plan view of the neuron device of this embodiment. FIG. 2 is a cross-sectional view of the neuron device, taken along the line A-A of FIG. 1. FIG. 3 is a cross-sectional view of the neuron device, taken along the line B-B of FIG. 2. FIG. 4 is a cross-sectional view of the neuron device, taken along the line C-C of FIG. 3.

The neuron device of this embodiment is formed on a SOI substrate that includes a supporting substrate 2, a buried insulating film 4 that is provided on the supporting substrate 2, and a SOI (Silicon On Insulator) layer 6. The SOI layer 6 is turned into a semiconductor layer 6 processed to have a plate-like form. A source region 6b and a drain region 6c are formed at a distance in the longitudinal direction from each other on the semiconductor layer 6. The portion of the semiconductor layer 6 located between the source region 6b and the drain region 6c serves as a channel region 6a. A protection film 8 made of an insulating material is provided to cover the upper face of the semiconductor layer 6, and a pair of gate insulating films 10 are provided to cover both side faces of the channel region 6a.

A floating gate electrode 12 is provided to cover the gate insulating films 10 and the protection film 8 located immediately above the channel region 6a. The floating gate electrode 12 includes: a first portion 12a that covers the gate insulating films 10 and the protection film 8 located immediately above the channel region 6a; a second portion 12b that connects to the first portion 12a, extends from a side face of the channel region 6a in a direction perpendicular to the side face, is provided on the insulating film 4, and has substantially the same width as the first portion 12a; and a third portion 12c that connects to the second portion 12b, is provided on the insulating film 4, and has a greater width than the second portion 12b. An interelectrode insulating film 14 is provided to cover the floating gate electrode 12. Control gate electrodes $16_1$ and $16_2$ (the number of control gate electrodes is two, in the example shown in the drawings) that extends in a direction substantially parallel to the longitudinal direction of the semiconductor layer 6 are provided on the portion of the interelectrode film 14 located immediately above the third portion 12c of the floating gate electrode 12.

Figure 5:
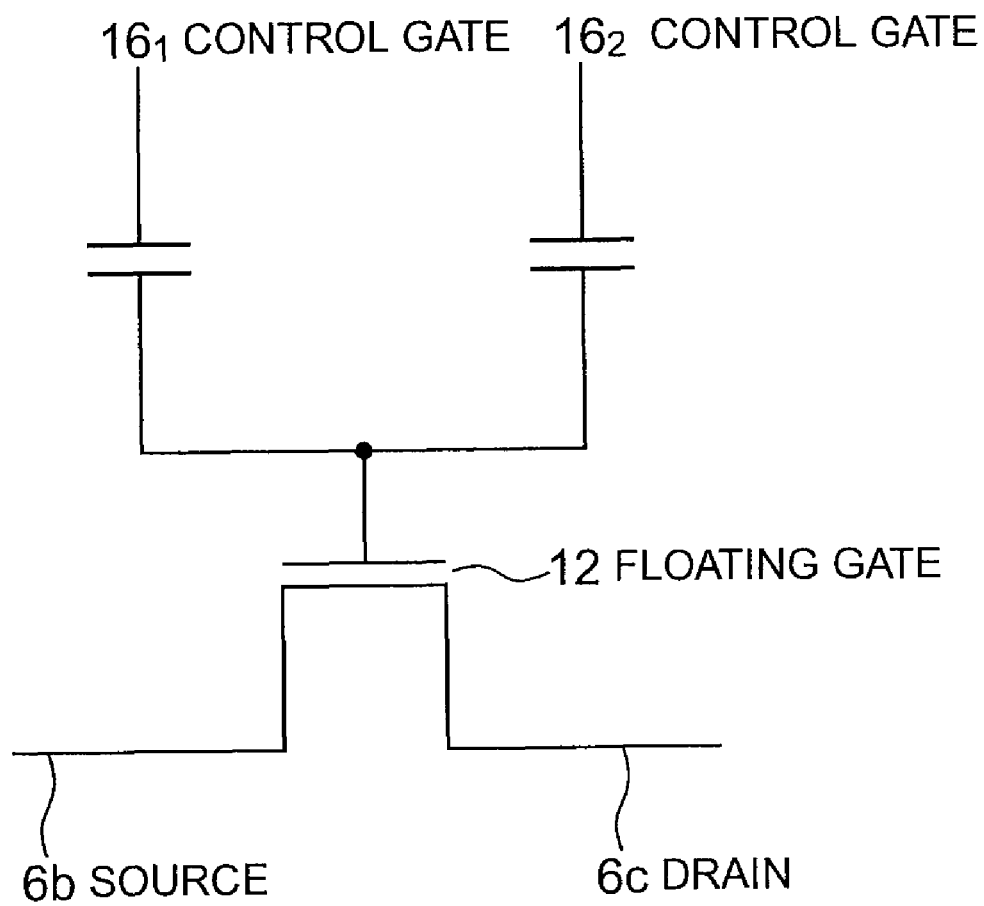
FIG. 5 is an equivalent circuit of the neuron device in accordance with the first embodiment.

As described above, in this embodiment, the control gate electrodes $16_1$ and $16_2$ are capacitive coupling to each other via the interelectrode insulating film 14. The equivalent circuit of the control gate electrodes $16_1$ and $16_2$ is as shown in FIG. 5, which is the same as the equivalent circuit of a conventional neuron device that has a gate of a stack structure that is formed with a floating gate electrode, an interelectrode insulating film, and control gate electrode, and is provided between a source region and a drain region formed at a distance from each other on a semiconductor substrate. More specifically, the potential of the channel region 6a is controlled by the floating gate electrode 12 that is capacitive coupling to the control gate electrodes $16_1$ and $16_2$, and a switching operation can be performed as in a flash memory or a regular transistor. Since the control gate electrodes $16_1$ and $16_2$ are provided, the ON/OFF state of the channel region 6a can be controlled in accordance with the input voltage of the control gate electrodes $16_1$ and $16_2$.

In this embodiment, however, unlike a conventional neuron device having its channel in the substrate, the neuron device has the channel region 6a formed in a direction perpendicular to the substrate.

Unlike a conventional neuron device, the neuron device of this embodiment has invariable capacitance between the control gate electrodes 16 and the floating gate electrode 14, even though the channel is made smaller. Also, since the channel region is surrounded by the floating gate electrode, the total number of depletion charges in the channel region can be controlled. Accordingly, the influence of the floating gate on the potential of the channel region can be increased. As a result of this, the short-channel effect resistance and the channel charge density can be made higher. Thus, the current drivability can be made larger than in conventional cases.

Referring now to FIGS. 6 to 9, a method for manufacturing the neuron device of this embodiment is described.

Figure 6:
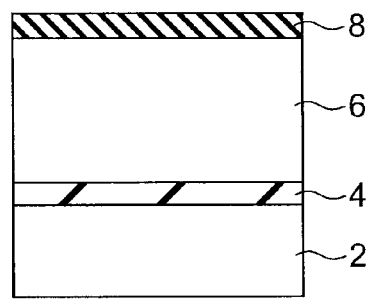
FIG. 6 is a cross-sectional view illustrating a procedure in the manufacturing of the neuron device in accordance with the first embodiment.
Figure 7A:
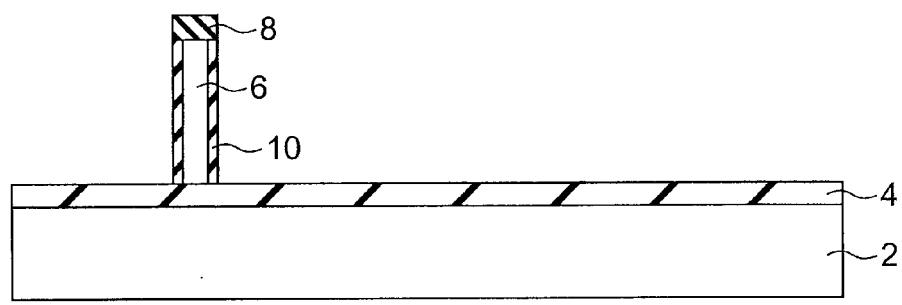
FIG. 7A is a cross-sectional view illustrating a procedure in the manufacturing of the neuron device in accordance with the first embodiment.
Figure 7B:
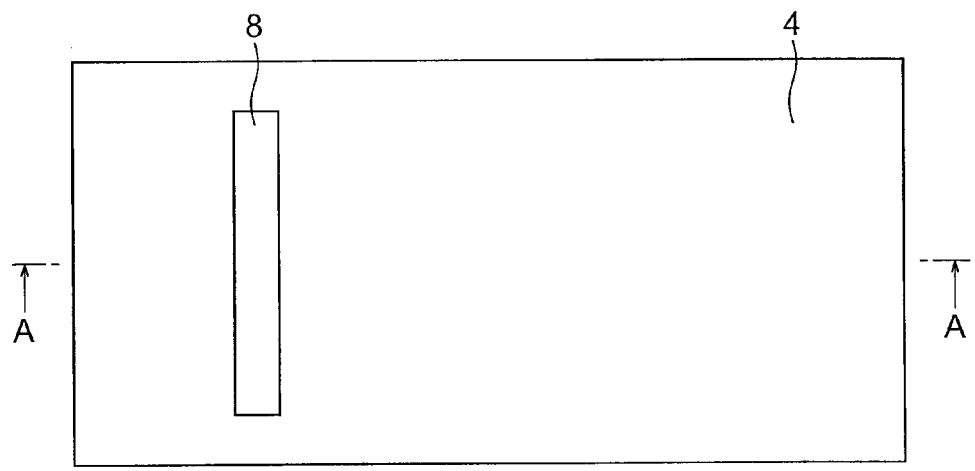
FIG. 7B is a plan view illustrating a procedure in the manufacturing of the neuron device in accordance with the first embodiment.
Figure 8A:
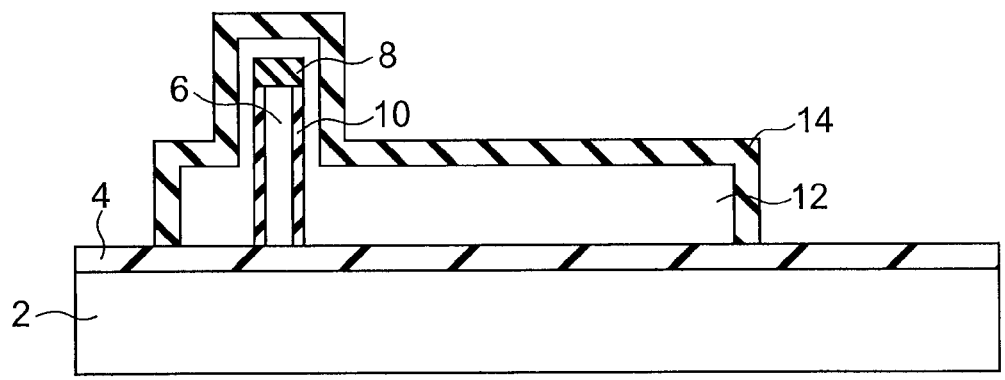
FIG. 8A is a cross-sectional view illustrating a procedure in the manufacturing of the neuron device in accordance with the first embodiment.
Figure 8B:
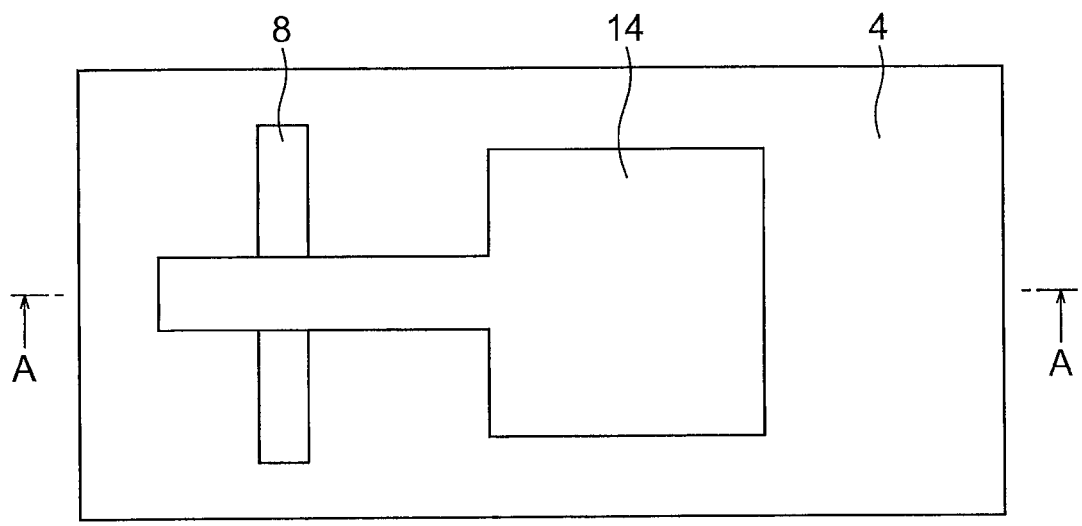
FIG. 8B is a plan view illustrating a procedure in the manufacturing of the neuron device in accordance with the first embodiment.

First, an insulating material, more specifically, a SiN film of approximately 50 nm in film thickness is formed on the SOI substrate formed with the supporting substrate 2, the buried insulating film 4, and the SOI layer 6 (FIG. 6). By a known lithography technique, a resist pattern (not shown) made of a resist is formed on the SiN film. With this resist pattern serving as a mask, patterning is performed on the SiN film and the SOI layer 6, so as to form the plate-like semiconductor layer 6 and the protection film 8 made of SiN placed on the semiconductor layer 6. After that, the side faces of the semiconductor layer 6 are subjected to thermal oxidation and then nitridation, so as to form the gate insulating films 10 that is silicon oxynitride films on the side faces of the semiconductor layer 6 (FIGS. 7A and 7B).

After the resist pattern is removed, a polycrystalline silicon film or a metal film containing phosphorus to be the floating gate electrode 12 is formed to cover the plate-like semiconductor layer 6. The interelectrode insulating film 14 is then formed to cover the polycrystalline silicon film or the metal film. A resist pattern (not shown) made of a resist is then formed on the interelectrode insulating film 14 by a lithography technique. With this resist pattern serving as a mask, patterning is performed on the interelectrode insulating film 14, the floating gate electrode 12, and the gate insulating films 10, so as to obtain the structure shown in FIGS. 8A and 8B. In this manner, the floating gate electrode 12 is turned into a structure that includes the first portion 12a that covers the gate insulating films 10 and the protection film 8 located immediately above the channel region 6a, the second portion 12b that is provided on the insulating film 4 so as to connect to the first portion 12a and has the same width as the first portion 12a, and the third portion 12c that is provided on the insulating film 4 so as to connect to the second portion 12b and has a greater width than the second portion 12b. As patterning is performed on the gate insulating films 10, the region of the plate-like semiconductor layer 6 that is not covered with the floating gate electrode 12 is exposed.

Figure 9:
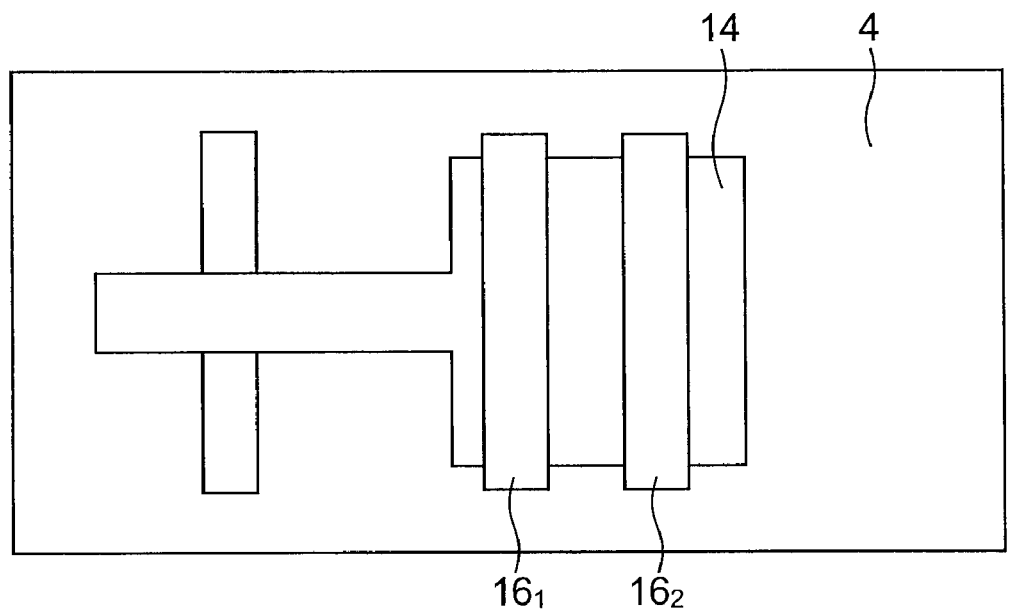
FIG. 9 is a plan view illustrating a procedure in the manufacturing of the neuron device in accordance with the first embodiment.

Impurities are then introduced through the exposed side face of the plate-like semiconductor layer 6, so as to form the source region 6b and the drain region 6c. After that, a control gate electrode film is formed, and patterning is performed on the control gate electrode film, so as to form the control gate electrodes $16_1$ and $16_2$ on the portion of the interelectrode insulating film 14 located immediately above the third portion 12c of the floating gate electrode 21 (FIG. 9). An interlayer insulating film (not shown) is then deposited, and contacts (not shown) continuing to the source region 6b, the drain region 6c, the floating gate electrode 12, and the control gate electrodes $16_1$ and $16_2$ are formed in the interlayer insulating film. In this manner, the neuron device of this embodiment is completed.

As described above, in accordance with this embodiment, a neuron device that can be easily made smaller and have large current drivability is obtained.

Second Embodiment

Figure 10:
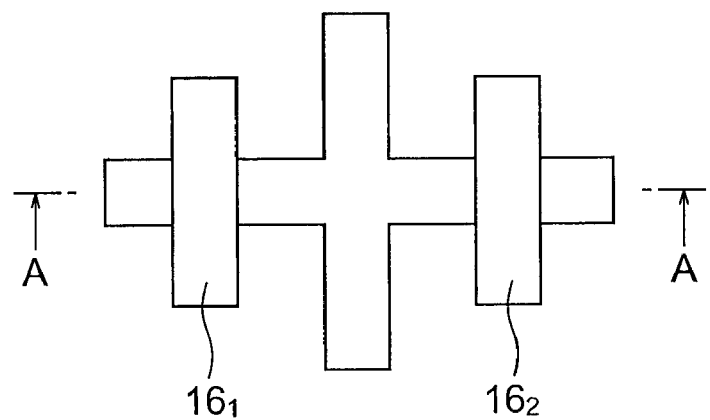
FIG. 10 is a plan view of a neuron device in accordance with a second embodiment of the present invention.
Figure 11:
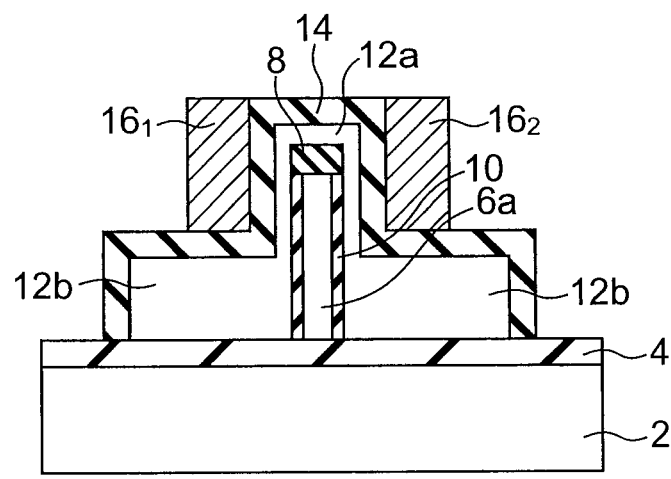
FIG. 11 is a cross-sectional view of the neuron device in accordance with the second embodiment.

Referring now to FIGS. 10 and 11, a neuron device in accordance with a second embodiment of the present invention is described. FIG. 10 is a plan view of the neuron device of this embodiment. FIG. 11 is a cross-sectional view of the neuron device, taken along the line A-A of FIG. 10.

In the neuron device of the first embodiment, the control gate electrodes $16_1$ and $16_2$ are provided on the third portion $12c$ of the floating gate electrode 12 on one side of the plate-like semiconductor layer 6, and the interelectrode insulating film 14 is sandwiched between the floating gate electrode 12 and the control gate electrodes $16_1$ and $16_2$. In the neuron device of this embodiment, on the other hand, the semiconductor layer 6 is interposed between the control gate electrodes $16_1$ and $16_2$, and the control gate electrodes $16_1$ and $16_2$ are provided on opposite sides of the floating gate electrode 12 from each other, so that the interelectrode insulating film 14 is sandwiched between the floating gate electrode 12 and the control gate electrodes $16_1$ and $16_2$. More specifically, the floating gate electrode 12 includes a first portion $12a$ that is provided on both side faces and the upper face of the channel region $6a$ so that the gate insulating films 10 and the protection film 8 are sandwiched between the first portion $12a$ and the channel region $6a$, and second portions $12b$ that connect to the first portion $12a$ and extend from both side faces of the channel region $6a$ in a direction perpendicular to the side faces of the channel region $6a$.

The interelectrode insulating film 14 is provided on the first portion $12a$ and the second portions $12b$ of the floating gate electrode 12, and the control gate electrodes $16_1$ and $16_2$ are provided on the second portions $12b$ so that the interelectrode insulating film 14 is interposed between the second portions $12b$ and the control gate electrodes $16_1$ and $16_2$.

With this structure, the device area can be made much smaller than the device area of the first embodiment, and higher integration can be realized. Also, in this embodiment, the control gate electrodes $16_1$ and $16_2$ are in contact with the floating gate electrode 12 along the side faces of the channel region $6a$. Accordingly, the capacitive coupling rate between the control gate electrodes $16_1$ and $16_2$ and the floating gate electrode 12 can be made higher, without an increase in the device area.

Like the neuron device of the first embodiment, the neuron device of this embodiment can have high short-channel effect resistance and high channel charge density. Accordingly, the current drivability can be made larger than in conventional cases.

Figure 12:
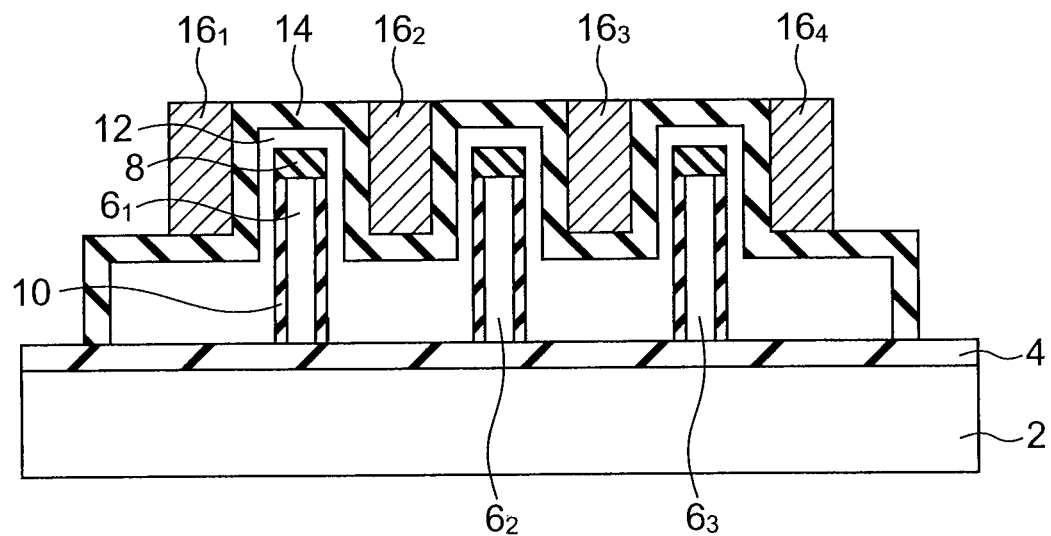
FIG. 12 is a cross-sectional view of the neuron device in accordance with a modification of the second embodiment.

Although only one plate-like semiconductor layer 6 forming the channel region is employed in this embodiment, two or more semiconductor layers (three semiconductor layers $6_1$, $6_2$, and $6_3$ in the example shown in FIG. 12) that are arranged parallel to one another may be provided, as in a neuron device in accordance with a modification of this embodiment. In this case, the upper faces of the semiconductor layers $6_1$, $6_2$, and $6_3$ are covered with the protection film 8 made of an insulating material. As in each semiconductor layer of the first and second embodiments, a channel region and source and drain regions are formed in each of the semiconductor layers $6_1$, $6_2$, and $6_3$. The side faces of each channel region are covered with the gate insulating films 10. The floating gate electrode 12 is provided on the side faces and the upper face of each channel region of the semiconductor layers $6_1$, $6_2$, and $6_3$, so that the gate insulating films 10 and the protection films 8 are interposed between the floating gate electrode 12 and the semiconductor layers $6_1$, $6_2$, and $6_3$. This floating gate electrode 12 includes: a first portion that is provided on both side faces and the upper face of the channel region of each semiconductor layer $6_i$ (i=1, 2, 3) so that the gate insulating films 10 and the protection film 8 are interposed between the first portion and the semiconductor layer $6_i$; a second portion that is provided between the channel regions of each two adjacent semiconductor layers; a third portion that extends from the side face of the channel region of the semiconductor layer $6_1$ on the opposite side from the semiconductor layer $6_2$ in a direction perpendicular to the side face; and a fourth portion that extends from the side face of the channel region of the semiconductor layer $6_3$ on the opposite side from the semiconductor layer $6_2$ in a direction perpendicular to the side face. Those first to fourth portions are connected so as to integrally form the floating gate electrode 12. The interelectrode insulating film 14 is provided on the floating gate electrode 12. Control gate electrodes $16_1$, $16_2$, $16_3$, and $16_4$ are provided on the second to fourth portions of the floating gate electrode 12 on both sides of the respective channel regions, so that the interelectrode insulating film 14 is interposed between the floating gate electrode 12 and the control gate electrodes $16_1$, $16_2$, $16_3$, and $16_4$. Those control gate electrodes $16_1$, $16_2$, $16_3$, and $16_4$ are provided so that the interelectrode insulating film 14 is interposed between the floating gate electrode 12 and the control gate electrodes $16_1$, $16_2$, $16_3$, and $16_4$ along the side faces of the respective channel regions of the semiconductor layers $6_1$, $6_2$, and $6_3$. Accordingly, the capacitance coupling rate between the control gate electrodes and the floating gate electrode can be made higher.

Like the second embodiment, this modification can greatly reduce the device area, and can increase the capacitance coupling rate between the floating gate electrode 12 and the control gate electrodes $16_1$, $16_2$, $16_3$, and $16_4$. Also, the short-channel effect resistance and the channel charge density can be made higher. Thus, the current drivability can be made larger than in conventional cases.

Referring now to FIGS. 13A to 18, a method for manufacturing the neuron device of this modification is described.

Figure 13A:
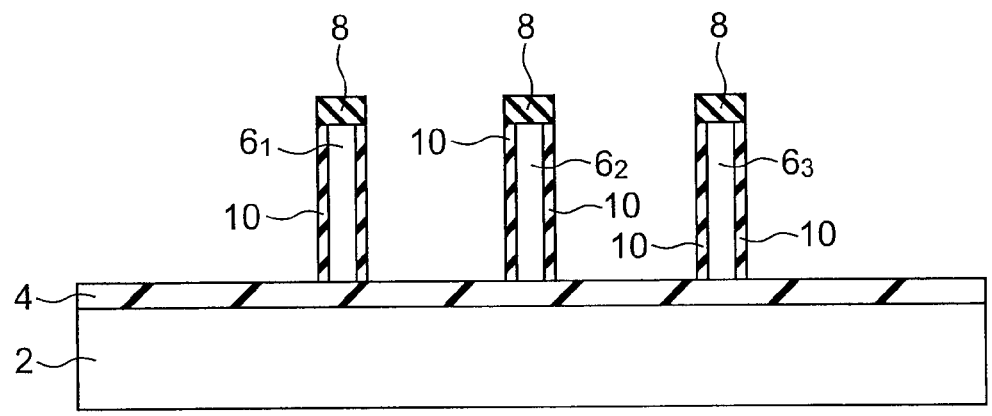
FIG. 13A is a cross-sectional view illustrating a procedure in the manufacturing of the neuron device in accordance with the second embodiment.
Figure 13B:
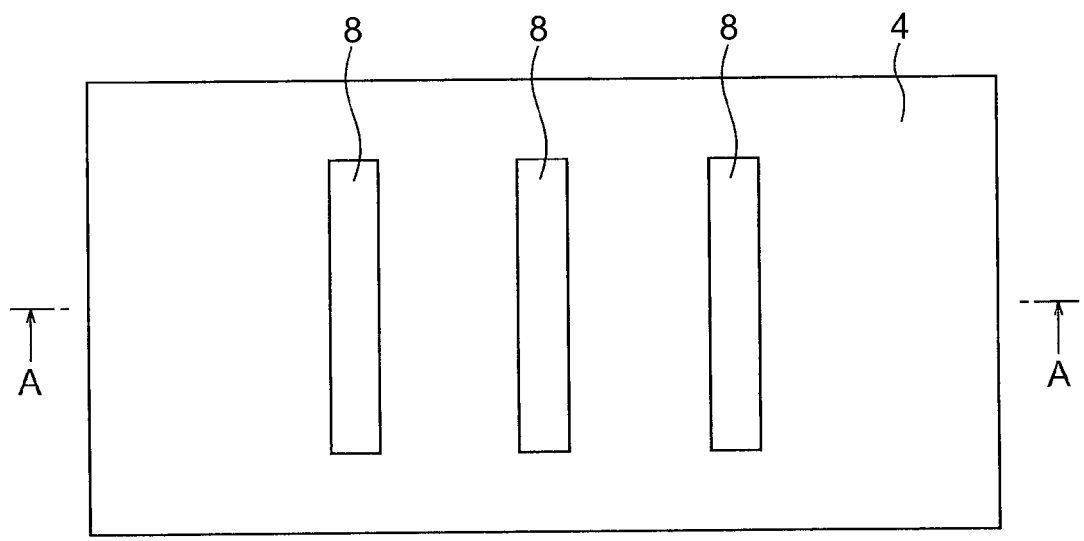
FIG. 13B is a plan view illustrating a procedure in the manufacturing of the neuron device in accordance with the second embodiment.

As in the first embodiment, an insulating material, more specifically, a SiN film of approximately 50 nm in film thickness is first formed on the SOI substrate (FIG. 6). By a known lithography technique, a resist pattern (not shown) made of a resist is formed on the SiN film. With this resist pattern serving as a mask, patterning is performed on the SiN film and the SOI layer 6, so as to form the plate-like semiconductor layers $6_1$ to $6_3$ and the protection film 8 placed on the semiconductor layers $6_1$ to $6_3$. After that, the side faces of each of the semiconductor layers $6_1$ to $6_3$ are subjected to thermal oxidation and then nitridation, so as to form the gate insulating films 10 that are silicon oxynitride films on the side faces of each of the semiconductor layers $6_1$ to $6_3$ (FIGS. 13A and 13B). FIG. 13B is a plan view, and FIG. 13A is a cross-sectional view, taken along the line A-A of FIG. 13B.

Figure 14:
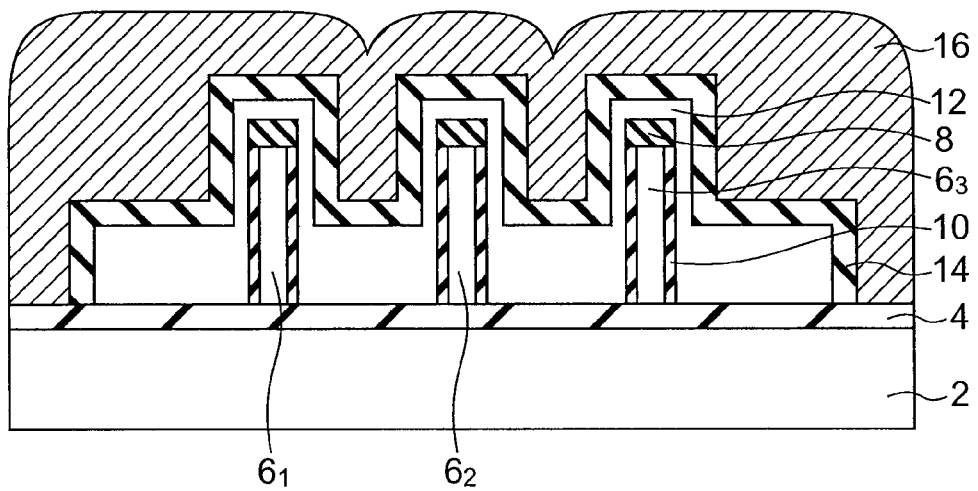
FIG. 14 is a cross-sectional view illustrating a procedure in the manufacturing of the neuron device in accordance with the second embodiment.

After the resist pattern is removed, a polycrystalline silicon film or a metal film containing phosphorus to be the floating gate electrode 12 is formed to cover each of the plate-like semiconductor layers $6_1$ to $6_3$. The interelectrode insulating film 14 is then formed to cover the polycrystalline silicon film or the metal film. A control gate electrode film 16 made of phosphorus-containing polycrystalline silicon or metal is then formed (FIG. 14).

Figure 15:
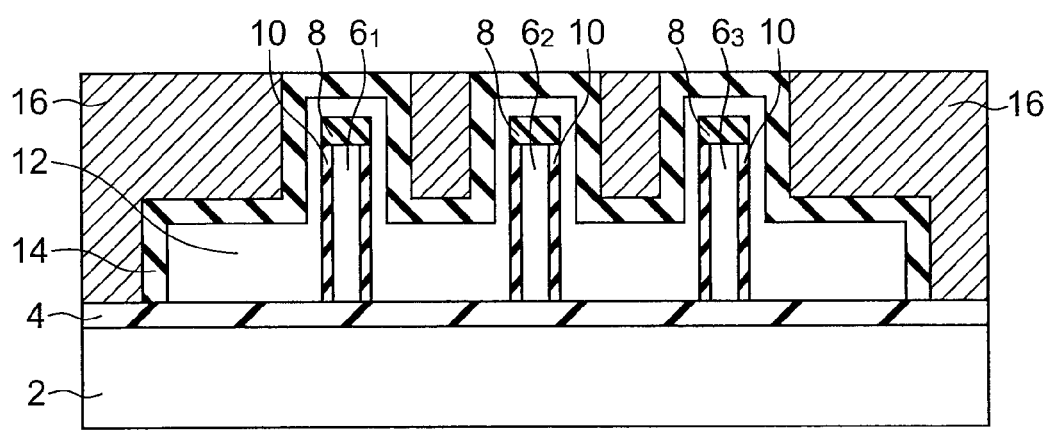
FIG. 15 is a cross-sectional view illustrating a procedure in the manufacturing of the neuron device in accordance with the second embodiment.
Figure 16:
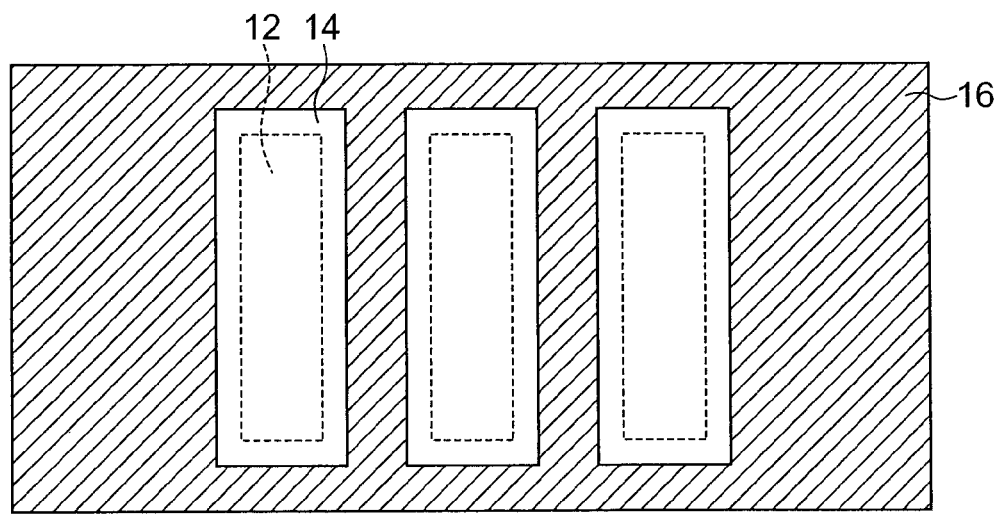
FIG. 16 is a plan view illustrating a procedure in the manufacturing of the neuron device in accordance with the second embodiment.
Figure 17:
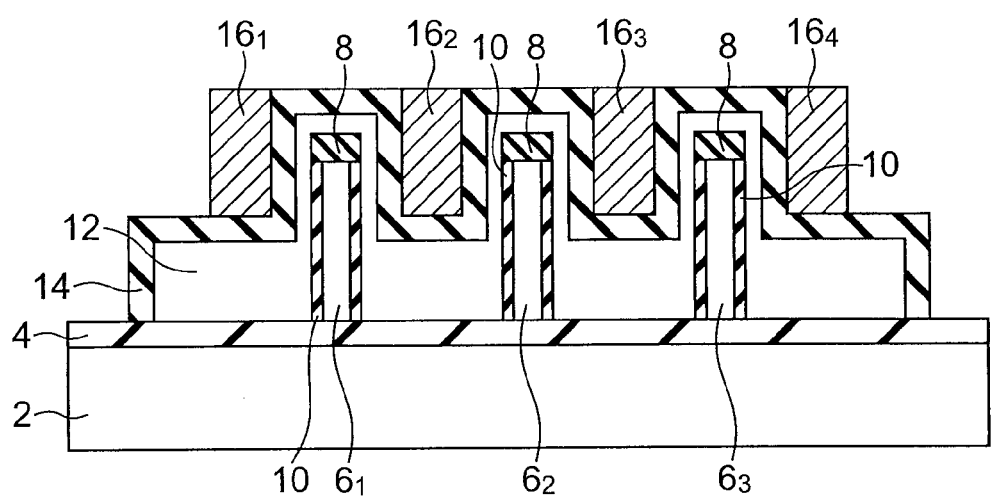
FIG. 17 is a cross-sectional view illustrating a procedure in the manufacturing of the neuron device in accordance with the second embodiment.
Figure 18:
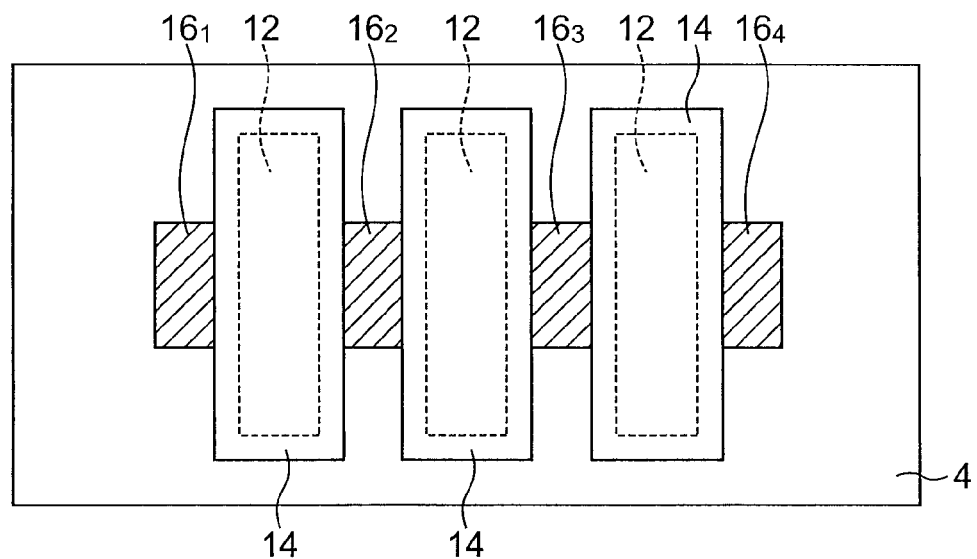
FIG. 18 is a plan view illustrating a procedure in the manufacturing of the neuron device in accordance with the second embodiment.

After that, the control gate electrode film 16 is flattened by CMP (Chemical Mechanical Polishing), until the interelectrode insulating film 14 is exposed (FIGS. 15 and 16). FIG. 15 is a cross-sectional view, and FIG. 16 is a plan view.

A resist pattern (not shown) made of a resist is then formed on the flattened control gate electrode film 16 and the exposed portions of the interelectrode insulating film 14 by a lithography technique. With this resist pattern serving as a mask, patterning is performed on the control gate electrode film 16, the interelectrode insulating film 14, the floating gate electrode 12, and the gate insulating films 10, so as to obtain the structure shown in FIGS. 17 and 18. In this manner, the control gate electrodes $16_1$, $16_2$, $16_3$, and $16_4$ are formed on the portions of the floating gate electrode 12 located on both sides of the respective channel regions via the interelectrode insulating film 14. Since the patterning is performed on the gate insulating films 10, the regions of the plate-like semiconductor layers $6_1$ to $6_3$ that are not covered with the floating gate electrode 12 are exposed.

Impurities are then introduced through the exposed side faces of the plate-like semiconductor layers $6_1$ to $6_3$, so as to form the source region 6b and the drain region 6c in each of the plate-like semiconductor layers $6_1$ to $6_3$. After that, an interlayer insulating film (not shown) is then deposited, and contacts (not shown) continuing to the source regions 6b, the drain regions 6c, the floating gate electrode 12, and the control gate electrodes $16_1$, $16_2$, $16_3$ and $16_4$ are formed in the interlayer insulating film. In this manner, the neuron device of this modification is completed.

As described above, in accordance with this embodiment, a neuron device that can be easily made smaller and have large current drivability is obtained as in the first embodiment.

Third Embodiment

Next, a neuron device in accordance with a third embodiment of the present invention is described.

The second embodiment is designed to have a higher capacitive coupling rate between the control gate electrodes and the floating gate electrode, compared with the capacitive coupling rate obtained in the first embodiment. In the neuron device of this embodiment, on the other hand, the capacitive coupling rate between the control gate electrodes and the floating gate electrode is made lower than the capacitive coupling rate obtained in the second embodiment.

Figure 19:
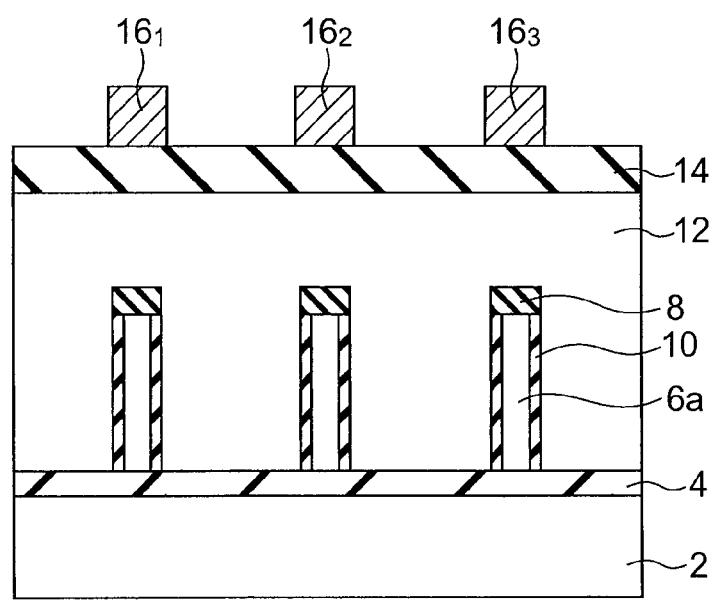
FIG. 19 is a cross-sectional view of a neuron device in accordance with a third embodiment.

FIG. 19 shows the neuron device of this embodiment. In the neuron device of this embodiment, the floating gate electrode 12 is provided so as to thoroughly bury the plate-like semiconductor layers $6_1$ to $6_3$, or to bury the gate insulating films 10 formed on the side faces of the semiconductor layers $6_1$ to $6_3$ and the protection films 8 formed on the upper faces of the semiconductor layers $6_1$ to $6_3$. Control gate electrodes $16_1$ to $16_3$ are then provided immediately above the semiconductor layers $6_1$ to $6_3$, so that the floating gate electrode 12 and the interelectrode insulating film 14 are interposed between the semiconductor layers $6_1$ to $6_3$ and the control gate electrodes $16_1$ to $16_3$. Accordingly, the capacitive coupling rate between the control gate electrodes and the floating gate electrode is lower than the capacitive coupling rate obtained in the second embodiment.

Figure 20:
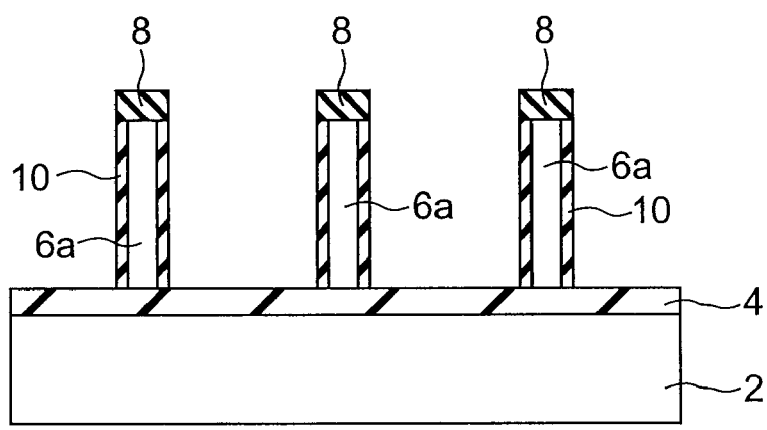
FIGS. 20 to 22 are cross-sectional views illustrating a procedure in the manufacturing of the neuron device in accordance with the third embodiment.
Figure 21:
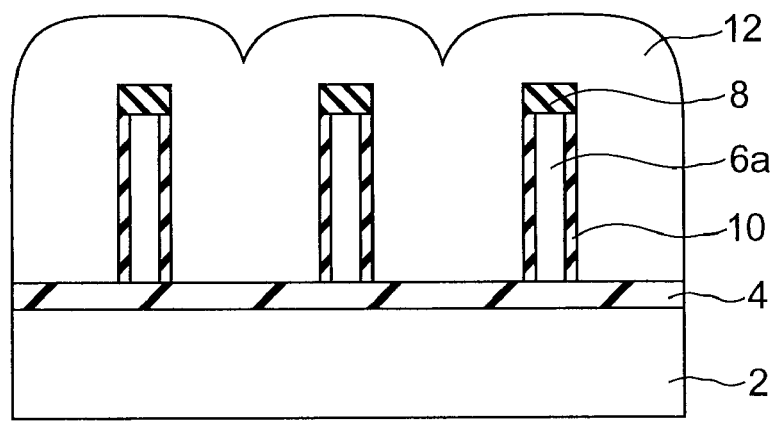
Figure 22:
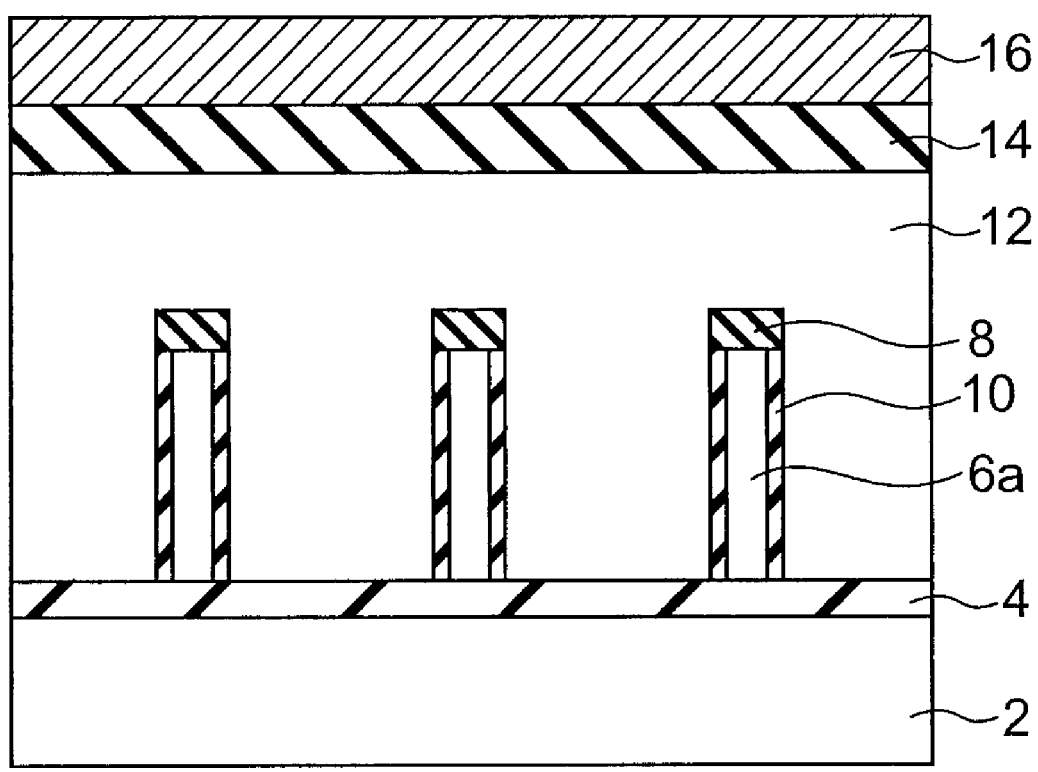

Referring now to FIGS. 20 to 22, a method for manufacturing the neuron device of this embodiment is described.

As in the modification of the second embodiment, the plate-like semiconductor layers $6_1$, $6_2$, and $6_3$ are formed on a SOI substrate, and gate insulating films 10 are formed on the side faces of each of the semiconductor layers $6_1$, $6_2$, and $6_3$ (FIG. 20).

A polycrystalline silicon film or a metal film containing phosphorus to be the floating gate electrode film 12 is formed to fill the spaces between the plate-like semiconductor layers $6_1$, $6_2$, and $6_3$ (FIG. 21).

The floating gate electrode film 12 is then flattened by CMP or the like. After that, the interelectrode insulating film 14 is formed on the floating gate electrode 12. A polycrystalline silicon film or a metal film containing phosphorus to be the control gate electrode film 16 is formed on the interelectrode insulating film 14 (FIG. 22). Patterning is then performed on the control gate electrode film 16, so as to form the control gate electrodes $16_1$, $16_2$, and $16_3$ shown in FIG. 19.

As described above, in accordance with this embodiment, a neuron device that can be easily made smaller and has large current drivability can be obtained.

In each of the above described first to third embodiments, a neuron device is formed on a SOI substrate. However, it is possible to form a neuron device on a bulk substrate.

Also, in each of the above described first to third embodiments, a neuron device is a double-gate structure that has a floating gate electrode and control gate electrodes. However, a neuron device may be a tri-gate structure in which the protection film is replaced with a gate insulating film. With such arrangement, the total number of depletion charges to be controlled by the floating gate electrode can be made smaller than that in a double-gate structure, though the difficulty in processing becomes larger. Accordingly, the influence of the floating gate electrode on the potential of the channel region can be increased. As a result, the current drivability can be made larger than that of a double-gate structure, and the thickness of each plate-like semiconductor layer can be made as large as the gate length. In such a tri-gate structure, the protection film 8 shown in FIG. 2, 11, 12, 19, or 22 is replaced with a film having the same material and thickness as the insulating films 10, and the Fin height (the thickness of each plate-like semiconductor layer) is substantially the same as the width.

In each of the first to third embodiments, the thickness of each plate-like semiconductor layer 6 (the thickness of the channel region), the thickness of each gate insulating film, and the thickness of the interelectrode insulating film are set at desired values, so that the restriction on short-channel effect can be optimized and the current drivability can be maximized. For example, to restrain short-channel effects, the thickness of each plate-like semiconductor layer should preferably be equal to or smaller than half the gate length. If each plate-like semiconductor layer is thicker than that, the gate electric field is cancelled by depletion charges, and the short-channel effect resistance becomes much lower. Also, to increase the current drivability, the gate insulating films 10 and the interelectrode insulating film 14 should preferably be thin, and more preferably, should be 4 nm or less in equivalent oxide thickness (EOT). If the gate insulating films 10 and the interelectrode insulating film 14 are thicker than that, the driving voltage becomes higher, and coexistence of the neuron device with a conventional MOSFET device becomes difficult.

Figure 23:
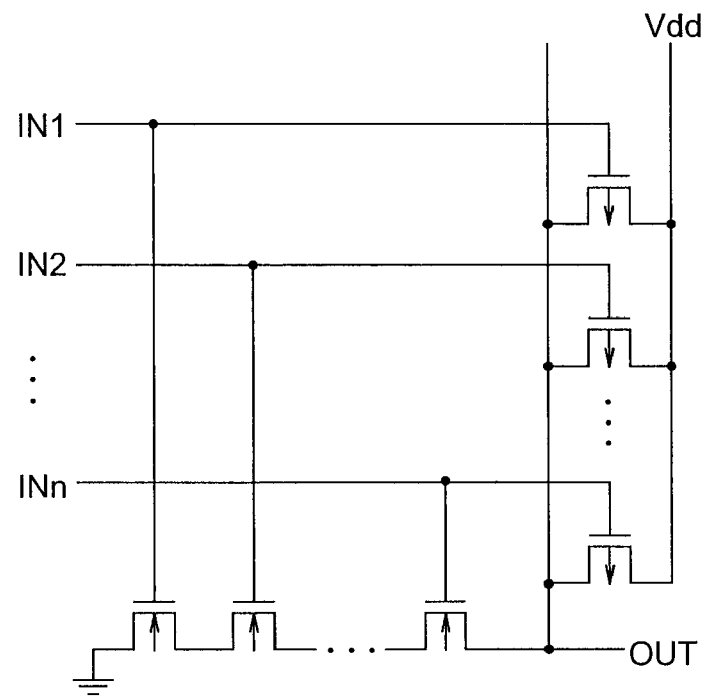
FIG. 23 is a circuit diagram of an n-input NAND logic circuit formed only with conventional devices.
Figure 24:
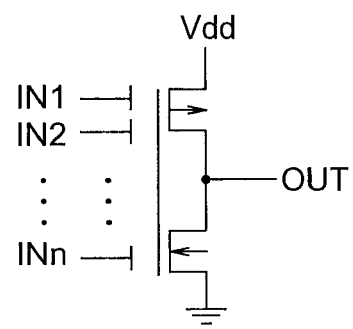
FIG. 24 is a circuit diagram of an n-input NAND logic circuit formed with neuron devices of an embodiment of the present invention.

The neuron device of each embodiment of the present invention can be employed in known various neuron-device application systems such as associative memory systems and image processing systems. For example, a neuron device of the present invention can be used as an n-input NAND device in a logic LSI. FIG. 23 shows an n-input NAND logic circuit that is formed only with conventional devices. In this case, n-MOS transistors are connected in series, and the delay becomes larger as the number of stages is greater. However, if an n-input NAND logic circuit is formed with neuron devices of any of the embodiments of the present invention, the circuit can be realized only with one stage, as shown in FIG. 24. Accordingly, the delay can be minimized, even when the number of stages becomes larger. In the n-input NAND logic circuit shown in FIG. 24, the channel region between a p-channel MOSFET and an n-channel MOSFET that are inverter-connected is covered with a common floating gate electrode, with gate insulating films being interposed in between. Further, n (n>1) control gate electrodes are provided on the floating gate electrode, with an interelectrode insulating film being interposed in between. Voltages IN1 to INn are then input to the respective control gate electrodes, so as to perform a NAND operation.

As described so far, in accordance with each of the above embodiments of the present invention, a neuron device that can be easily made smaller and has large current drivability can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A neuron device comprising:
   a semiconductor layer provided above a substrate and being of a first conductivity type;
   source and drain regions formed in the semiconductor layer at a distance from each other, and being of a second conductivity type;
   a protection film formed on an upper face of the semiconductor layer;
   a channel region formed in the semiconductor layer between the source region and the drain region;
   a pair of gate insulating films formed on two side faces of the channel region;
   a floating gate electrode including: a first portion provided on the two side faces and an upper face of the channel region, with the gate insulating films and the protection film being interposed between the first portion and the channel region respectively; a second portion connected to the first portion, and provided on the substrate so as to extend from one of the two side faces of the channel region in a direction perpendicular to the one of the two side faces; and a third portion provided on the substrate so as to connect to the end portion of the second portion on the opposite side from the first portion, and having a greater width than the first portion and the second portion;
   an interelectrode insulating film provided on the first to third portions of the floating gate electrode; and
   a plurality of control gate electrodes provided on the third portion of the floating gate electrode, so that the interelectrode insulating film is interposed between the third portion and the control gate electrodes.

2. The device according to claim 1, wherein the substrate is a SOI substrate, with the semiconductor layer being a SOI layer of the SOI substrate.

3. A neuron device comprising:
   a semiconductor layer provided above a substrate and being of a first conductivity type;
   source and drain regions formed in the semiconductor layer at a distance from each other, and being of a second conductivity type;
   a protection film formed on an upper face of the semiconductor layer;
   a channel region formed in the semiconductor layer between the source region and the drain region;
   a pair of gate insulating films formed on two side faces of the channel region;
   a floating gate electrode that includes: a first portion provided on the two side faces and an upper face of the channel region, with the gate insulating films and the protection film being interposed between the first portion and the channel region respectively; and second and third portions connected to the first portion, and provided on the substrate so as to extend from the two side faces of the channel region in directions perpendicular to the two side faces;
   an interelectrode insulating film provided on the first to third portions of the floating gate electrode; and
   first and second control gate electrodes provided on the second and third portions of the floating gate electrode, so that the interelectrode insulating film is interposed between the second and third portions and the first and second control gate electrodes.

4. The device according to claim 3, wherein the first and second control gate electrodes are provided along the side faces of the channel region, with the interelectrode insulating film being interposed between the first and second control gate electrodes and the side faces of the channel region.

5. The device according to claim 3, wherein the substrate is a SOI substrate, with the semiconductor layer being a SOI layer of the SOI substrate.

6. A neuron device comprising:
   first and second semiconductor layers provided in parallel above a substrate and being of a first conductivity type;
   first source and drain regions formed in the first semiconductor layer at a distance from each other, and being of a second conductivity type;
   second source and drain regions formed in the second semiconductor layer at a distance from each other, and being of the second conductivity type;
   first and second protection films formed on upper faces of the first and second semiconductor layers respectively;
   a first channel region formed in the first semiconductor layer between the first source region and the first drain region;
   a second channel region formed in the second semiconductor layer between the second source region and the second drain region;
   a pair of first gate insulating films formed on two side faces of the first channel region;
   a pair of second gate insulating films formed on two side faces of the second channel region;
   a floating gate electrode that includes: a first portion provided on the two side faces and an upper face of the first channel region, with the first gate insulating films and the first protection film being interposed between the first portion and the first channel region respectively; a second portion provided on the two side faces and an upper face of the second channel region, with the second gate insulating films and the second protection film being interposed between the second portion and the second channel region respectively; a third portion that connected to the first portion, and provided on the substrate so as to extend from the side face of the first channel region on the opposite side from the second channel region in a direction perpendicular to the side face; a fourth portion connected to the first and second portions, and provided on a portion of the substrate, the portion being located between the first channel region and the second channel region; and a fifth portion connected to the second portion, and provided on the substrate so as to extend from the side face of the second channel region on the opposite side from the first channel region in a direction perpendicular to the side face;
   an interelectrode insulating film provided on the first to fifth portions of the floating gate electrode; and
   first to third control gate electrodes provided on the third to fifth portions of the floating gate electrode respectively, so that the interelectrode insulating film is interposed between the third to fifth portions and the first to third control gate electrodes.

7. The device according to claim 6, wherein:
the first control gate electrode is provided along the side face of the first channel region on the opposite side from the second channel region, with the interelectrode insulating film being interposed between the first control gate electrode and the side face of the first channel region; and
the second control gate electrode is provided along side faces of the first and second channel regions facing each other, with the interelectrode insulating film being interposed between the second control gate electrode an the side faces.

8. The device according to claim 6, wherein the substrate is a SOI substrate, with the semiconductor layer being a SOI layer of the SOI substrate.

9. A neuron device comprising:
first and second semiconductor layers provided in parallel above a substrate and being of a first conductivity type;
first source and drain regions formed in the first semiconductor layer at a distance from each other, and being of a second conductivity type;
second source and drain regions formed in the second semiconductor layer at a distance from each other, and being of the second conductivity type;
first and second protection films formed on upper faces of the first and second semiconductor layers respectively;
a first channel region formed in the first semiconductor layer between the first source region and the first drain region;
a second channel region formed in the second semiconductor layer between the second source region and the second drain region;
a pair of first gate insulating films formed on two side faces of the first channel region;
a pair of second gate insulating films formed on two side faces of the second channel region;
a floating gate electrode provided to cover the first and second semiconductor layers;
an interelectrode insulating film provided to cover the floating gate electrode; and
first and second control gate electrodes provided above the first and second semiconductor layers, with the floating gate electrode and the interelectrode insulating film being interposed between the first and second semiconductor layers and the first and second control gate electrodes.

10. The device according to claim 9, wherein the substrate is a SOI substrate, with the semiconductor layer being a SOI layer of the SOI substrate.

* * * * *